United States Patent [19]

Tikhonov

[11] Patent Number: 5,741,732
[45] Date of Patent: Apr. 21, 1998

[54] METHOD FOR DETECTING IMPLANTATION MASK MISALIGNMENT

[75] Inventor: Victor Tikhonov, San Antonio, Tex.

[73] Assignees: Sony Corporation, Tokyo, Japan; Sony Electronics Inc., Park Ridge, N.J.

[21] Appl. No.: 434,192

[22] Filed: May 3, 1995

[51] Int. Cl.$^6$ .................................................. H01L 21/77
[52] U.S. Cl. ........................... 438/149; 438/14; 438/162; 438/517
[58] Field of Search ........................ 437/44, 20, 21, 437/29, 40 TFT, 41 TFT, 54, 59, 229, 228 M, 228 MRK; 148/DIG. 102–DIG. 106; 438/14, 149

[56] References Cited

U.S. PATENT DOCUMENTS

| | | | |
|---|---|---|---|
| 4,607,213 | 8/1986 | Neukermans et al. | 148/DIG. 102 |
| 4,647,850 | 3/1987 | Henderson et al. | 148/DIG. 102 |
| 4,648,174 | 3/1987 | Temple et al. | 148/DIG. 106 |
| 5,273,915 | 12/1993 | Hwang et al. | 437/59 |
| 5,300,454 | 4/1994 | Taft et al. | 148/DIG. 106 |
| 5,334,541 | 8/1994 | Adams et al. | 437/228 |
| 5,369,050 | 11/1994 | Kawai | 437/62 |

FOREIGN PATENT DOCUMENTS

59188648  10/1984  Japan ........................ 148/DIG. 102

*Primary Examiner*—Michael Trinh
*Attorney, Agent, or Firm*—Ronald P. Kananen

[57] ABSTRACT

A test apparatus for determining alignment of an implantation mask in the construction of thin film transistors (TFTs), a method for determining the alignment of an implantation mask employed in the construction of TFTs, and a method for constructing TFTs, employing a test implantation mask for the construction of an implantation region for multiple adjacent TFTs, are provided in which the test implantation mask has a sloped or stepped profile such that the masked area increases as the test implantation mask extends from one TFT to another TFT.

18 Claims, 9 Drawing Sheets

METHOD FOR DETECTING IMPLANTATION MASK MISALIGNMENT

BACKGROUND OF THE INVENTION

1. Field of the Invention

The present invention pertains to a method and apparatus for detecting and measuring implantation mask misalignment in the construction of a thin film transistor (TFT). More particularly, this invention relates to a method and apparatus for detecting misalignment of an implantation mask, while providing measurement capability and traceability. Still more particularly, this invention relates to a method and apparatus for providing direct electrical measurements and a test structure to provide a misalignment value in microns or fractions of microns and the direction of misalignment of an implantation mask during TFT fabrication.

2. Discussion of the Background

Semiconductor devices have increasingly become more integrated and miniaturized. Accordingly, more and more demands are placed upon the masking and etching techniques used in the construction of the semiconductor devices.

For example, in the fabrication of a semiconductor device, such as a MOSFET (metal oxide semiconductor field effect transistor), having alignment of the patterning masks is critical. In the construction of such a semiconductor device, a device area is first isolated by a thick field oxide and a polysilicon layer is formed on the entire surface of the substrate and patterned with a mask aligned with the device area so as to form the gate electrode. In a conventional MOSFET based on a 0.5 μm design, the width of the gate electrode is designed to be 0.5 μm. As this example demonstrates, mask pattern alignment plays a significant role in efficient and accurate manufacturing of semiconductor devices.

U.S. Pat. No. 5,369,050 to Kawai discloses a direct alignment technique. In this method, a semiconductor layer is formed with a convex device area and a convex alignment mark on an insulating layer, the insulating layer is etched around the alignment mark using the alignment mark as a mask so as to form a groove around the alignment mark, and a mask pattern is then aligned with the device using the alignment mark surrounded by the groove as a reference point. However, this document does not provide a method for determining whether semiconductor failure is a result of mask misalignment, nor does this reference provide a method for measuring the distance by which the mask is misaligned.

The problem of mask alignment is particularly compounded in the fabrication of thin film transistors (TFTs), in which the size of the components are smaller, the dimensional tolerances are tighter, and alignment/misalignment of the patterning masks cannot be directly visualized. Despite significant technological advances in the construction of 0.5 μm TFTs, it remains difficult to determine whether the failure of a manufactured TFT is attributable to misalignment of a patterning mask and, if TFT failure is a result of mask misalignment, to determine the direction and distance of misalignment. In general, the art has lacked an effective method for identifying whether a certain implant mask was misaligned and the degree of such misalignment after implantation is done.

SUMMARY OF THE INVENTION

Accordingly, an object of the present invention is to provide a novel TFT apparatus for measuring whether an implantation mask in fabrication was misaligned and for measuring the distance by which the implantation mask was misaligned.

It is another object of the present invention to provide a method for measuring whether an implantation mask was misaligned and for measuring the distance by which the implantation mask was misaligned.

These and other objects have been achieved by means of a test apparatus for determining alignment of an implantation mask in the construction of thin film transistors (TFTs), comprising a test implantation mask for the construction of an implantation region for multiple adjacent TFTs, wherein said test implantation mask has a sloped or stepped profile in which the masked area increases as the test implantation mask extends from one TFT to an adjacent TFT. If the test implantation mask has a stepped profile, then the masked area increases sequentially in discrete steps as the test implantation mask extends from one TFT to an adjacent TFT.

These and other objects of the present invention have also been obtained by means of a method of measuring whether an implantation mask was misaligned and for measuring the distance by which the implantation mask was misaligned, employing such a test apparatus. Such a method for determining the alignment of an implantation mask employed in the construction of TFTs comprises the steps of employing a test implantation mask for the construction of an implantation region for multiple adjacent TFTs, wherein said test implantation mask has a sloped or stepped profile in which the masked area increases as the test implantation mask extends from one TFT to an adjacent TFT; selecting a step of the test implantation mask so as to correspond to proper alignment of the implantation mask; and determining whether the TFT corresponding to said selected step of the test implantation mask is properly functioning. Additionally, these objects, among others, have been achieved by means of a method of properly aligning an implantation mask, employing such a test apparatus.

Still further, the objects of the present invention have been provided by a method of fabricating a TFT comprising properly aligning an implantation mask prior to implantation. Such a method for constructing TFTs comprises the steps of determining the alignment of an implantation mask employed in the construction of thin film transistors (TFTs); properly aligning said mask in accordance with said alignment determination; and fabricating said thin film transistors, wherein said alignment determination comprises the steps of employing an implantation mask for the construction of an implantation region for a multiple number of TFTs, wherein said implantation mask has a sloped or stepped profile in which the masked area increases as the implantation mask extends from one semiconductor device to an adjacent semiconductor device; selecting a portion of the implantation mask so as to correspond to the proper alignment of the implantation mask; and determining whether the TFT corresponding to said selected portion of the implantation mask is properly functioning.

BRIEF DESCRIPTION OF THE DRAWINGS:

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

The construction of a TFT is representatively depicted in the drawings in a way which is intended to facilitate understanding of the invention. Thus, it is recognized that a TFT made according to the present invention may differ in shape or configuration. For example, a static random access memory (SRAM) differs slightly from the depicted shape, but the principles for visualizing the use of the alignment test apparatus of the present invention are applicable to substantially any shape TFT and the following steps are to be understood as representative. It is also to be understood that a number of cleaning and processing steps may be inserted between the steps represented in the drawings and described in this specification.

Figure 1:
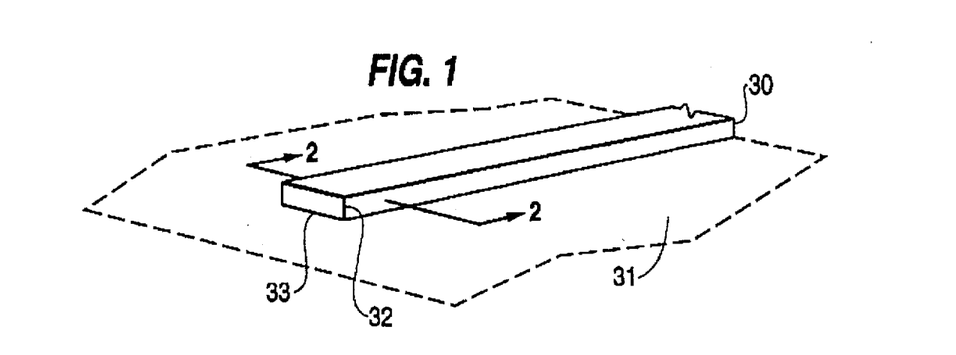
FIG. 1 is a perspective view of a polysilicon gate formed in the construction of a TFT.

Referring now to the drawings, wherein like reference numerals designate identical or corresponding parts throughout the several views, and more particularly to FIG. 1 thereof, in which a polysilicon gate 30 is formed on a suitable substrate 31 by conventional steps including a standard polysilicon deposition followed by application of a photoresist coating, pattern exposure according to a mask; development of the photoresist coating; etching of the polysilicon in accordance with the pattern exposure of the mask; and a photoresist stripping step. These steps are interleaved with various cleaning steps as are well known in this art. This, as seen in FIG. 1, results in a polysilicon gate 30 formed on an appropriate substrate 31. For purposes of discussion, the polysilicon gate 30 can be envisioned as an elongated structure having a rectangular cross-section with a thickness 32 determined by the final product. The width 33 of the polysilicon gate 30 is determined by the anticipated width of the gate in the TFT when formed.

Figure 2:
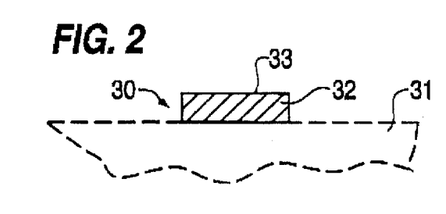
FIG. 2 depicts a cross-sectional view taken along lines 2—2 of FIG. 1.

FIG. 2 illustrates a two-dimensional cross-sectional view of the polysilicon gate 30 on the substrate 31 taken along the line 2—2 of FIG. 1. The gate 30 is shown having a width 33 and a thickness 32 in its rectangular cross-sectional shape.

Figure 3:
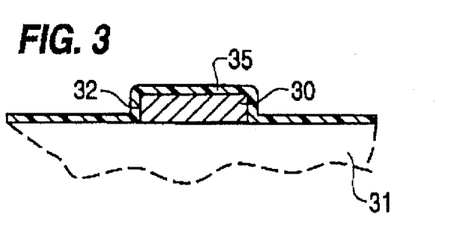
FIG. 3 illustrates a cross-sectional view of the gate of FIG. 2 on which an oxide insulation layer has been deposited so as to isolate the gate and channel.

As seen in FIG. 3, a SiO insulation layer 35 is deposited on the gate 30 to isolate the gate and the channel which will be formed in the TFT. The SiO insulation layer 35 extends on the upper surface of the gate 30, on its sides along its thickness 32 and on the substrate 31, thus isolating the gate and the channel of the TFT when finally formed.

Figure 4:
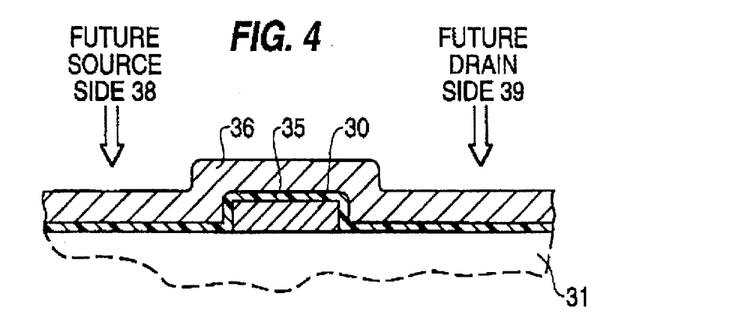
FIG. 4 is a side cross-sectional view of the gate and oxide layer of FIG. 3 on which a TFT channel has been formed and showing a future source side and a future drain side, for orientation.
Figure 5:
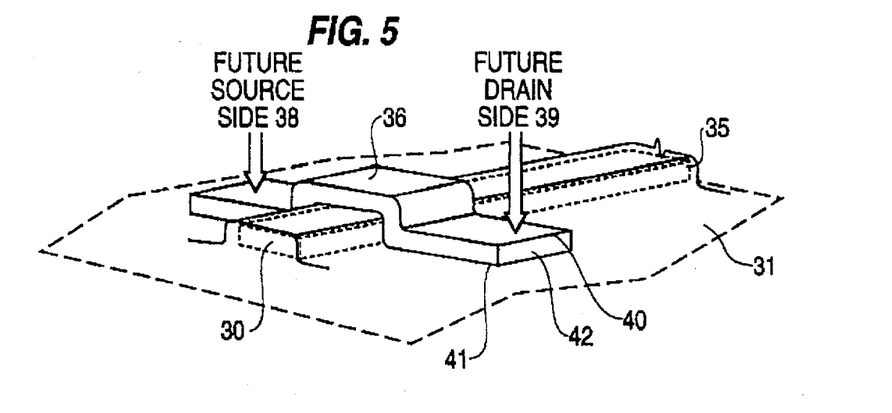
FIG. 5 depicts a perspective view of the device of FIG. 4.

In the step shown in FIGS. 4 and 5, a channel layer is formed in accordance with a deposition, patterning, etching, and processing similar to that employed in the construction of the gate 30. Thus, a channel layer 36 is formed over the SiO layer 35 to form the structure depicted in FIGS. 4 and 5. As seen in FIGS. 4 and 5, the future source side 38 is at the left of the cross-sectional view, while the future drain side 39 is at the right of the cross-sectional view. The TFT channel layer 36 is elongated and defines a generally rectangular cross section 42 having dimensions determined by the TFT to be formed. The width of the layer 36 is shown by the width of the surface 40, while the thickness is depicted by 41.

Figure 6:
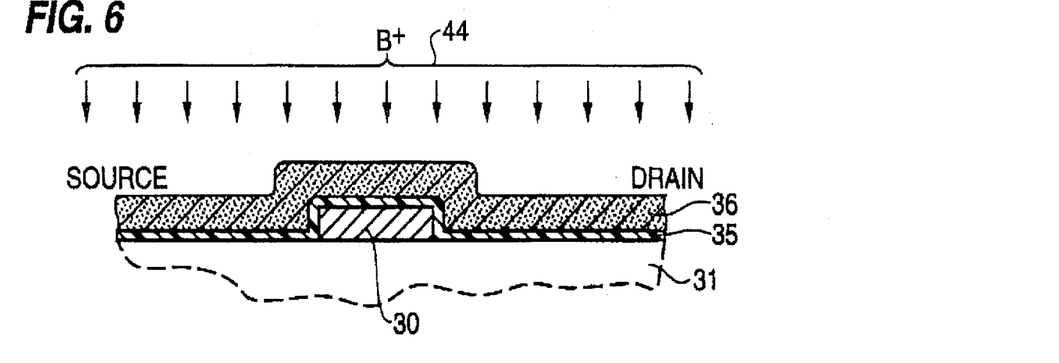
FIG. 6 illustrates a side cross-sectional view of the device showing a channel layer implanted to achieve the desired channel conductivity and type.

The structure of FIGS. 4 and 5 is then subjected to channel implantation, as illustrated in FIG. 6. Conventionally, a variety of ions, atoms, and compounds can be employed in this implantation step, the selection of which ions, atoms, and compounds depends upon the desired properties and characteristics of the TFT, for example, a p-type TFT or an n-type TFT. In FIG. 6, boron ions (B+), shown representatively by the reference numeral 44 are implanted to achieve a desirable channel conductivity and type. Boron ions are commonly used to construct a p-type channel. As depicted, no mask is employed in the construction of the channel layer implant.

Figure 7:
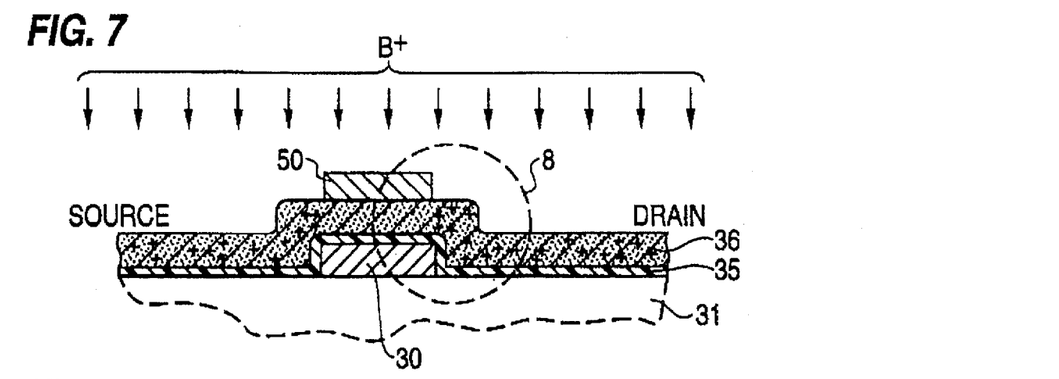
FIG. 7 depicts the structure of FIG. 6, upon which has been overlaid a mask for a light doped drain (LDD) implantation.

As illustrated in FIG. 7, the implanted structure of FIG. 6 is overlaid with a photoresist mask 50 and then implanted with a light doped drain (LDD) implant, as indicated by the + signs. Conventionally, a variety of ions, atoms, and compounds are employed in this implantation step, the selection of which ions, atoms, and compounds depends upon the desired properties and characteristics of the TFT. The LDD implant is employed to reduce the electric field strength near the drain. This reduction is achieved by spreading the charge near the drain, resulting in better conductivity, a weaker electric field, reduced impact ionization, and a smaller risk of dielectric breakdown. The LDD implantation is carried using a photoresist mask 51 to protect a portion of the channel from LDD implantation.

Figure 8:
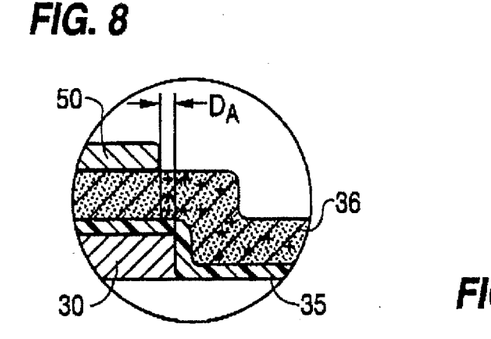
FIG. 8 is an enlarged view of the enclosed portion 8 shown in FIG. 7 identifying a critical distance $D_A$ between an edge of a LDD implantation mask and an exterior edge of the polysilicon gate.
Figure 9:
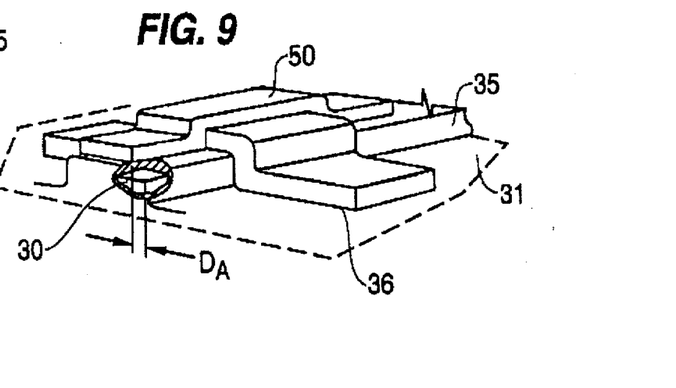
FIG. 9 illustrates a perspective view showing the critical distance $D_A$ at the stage of processing shown in FIG. 7.

FIG. 8 illustrates that on the drain side the LDD-implanted channel layer overlaps the end of the oxide insulation layer which is underlaid by the polysilicon gate. This distance $D_A$ is conventionally in the range of 0.2 µm to 2 µm. FIG. 9 illustrates a perspective view showing the critical distance $D_A$ at the stage of processing shown in FIG. 7.

Figure 10:
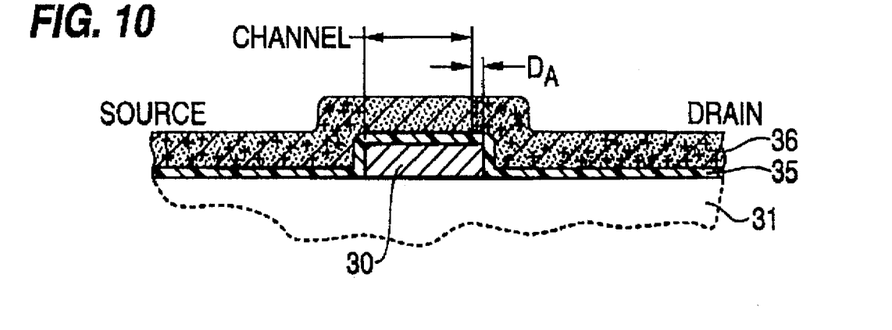
FIG. 10 depicts a cross-sectional view of the device in which the LDD implantation mask has been stripped from the device.

FIG. 10 is a cross-sectional view of the device showing the implantation mask stripped from the device.

Figure 11:
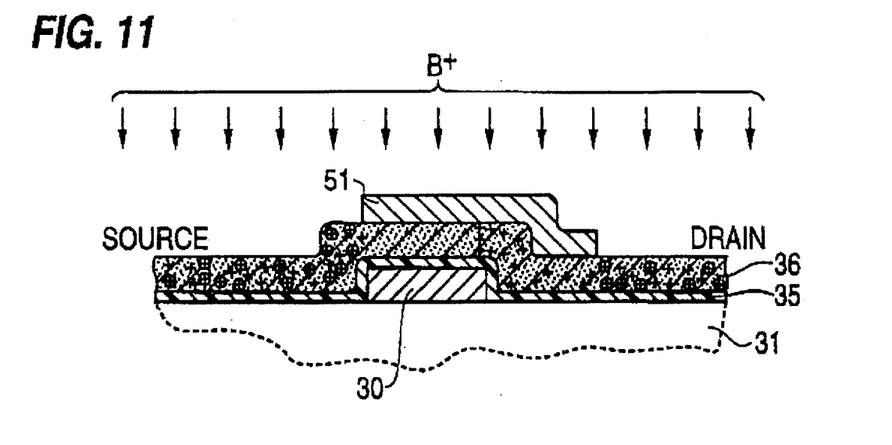
FIG. 11 illustrates a source-drain implantation in which an implantation mask has been overlaid a portion of the device to prevent implantation of that portion.

After LDD implantation, a pattern mask 51 is positioned for source-drain implantation. Source-drain implantation is usually heavier than the other implantations and, as illustrated in FIG. 11, our exemplary TFT has employed boron ions for the source-drain implantation. The source-drain implantation is represented by the ⊕ signs. Conventionally, a variety of ions, atoms, and compounds are employed in this implantation step, the selection of which ions, atoms, and compounds depends upon the desired properties and characteristics of the TFT. In masking for source-drain implanting, the channel, as well as a portion of the LDD-implanted channel layer on the drain side of the channel layer, is protected from implantation.

Figure 12:
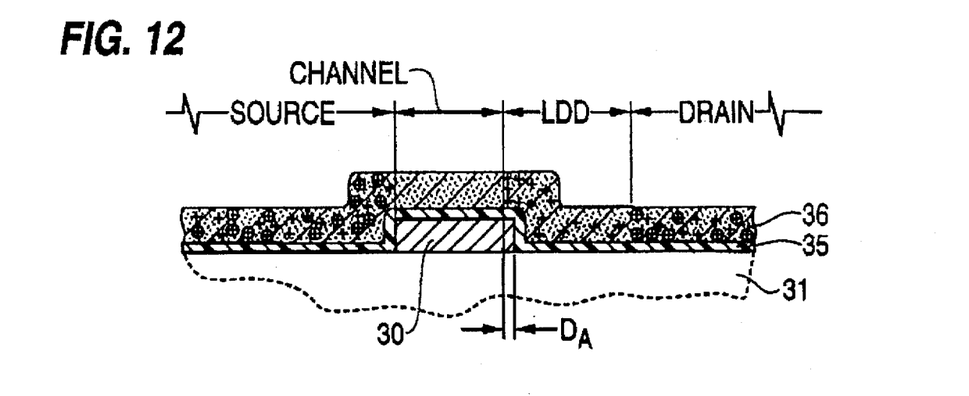
FIG. 12 depicts a side cross-sectional view of the TFT as built in accordance with the steps depicted in FIGS. 1 to 11.

After source-drain implantation, the mask 51 is stripped. At this point the TFT can be represented by FIG. 12. The remaining features of the TFT can then be constructed by conventional steps, including metallization of various portions of the device.

Figure 13:
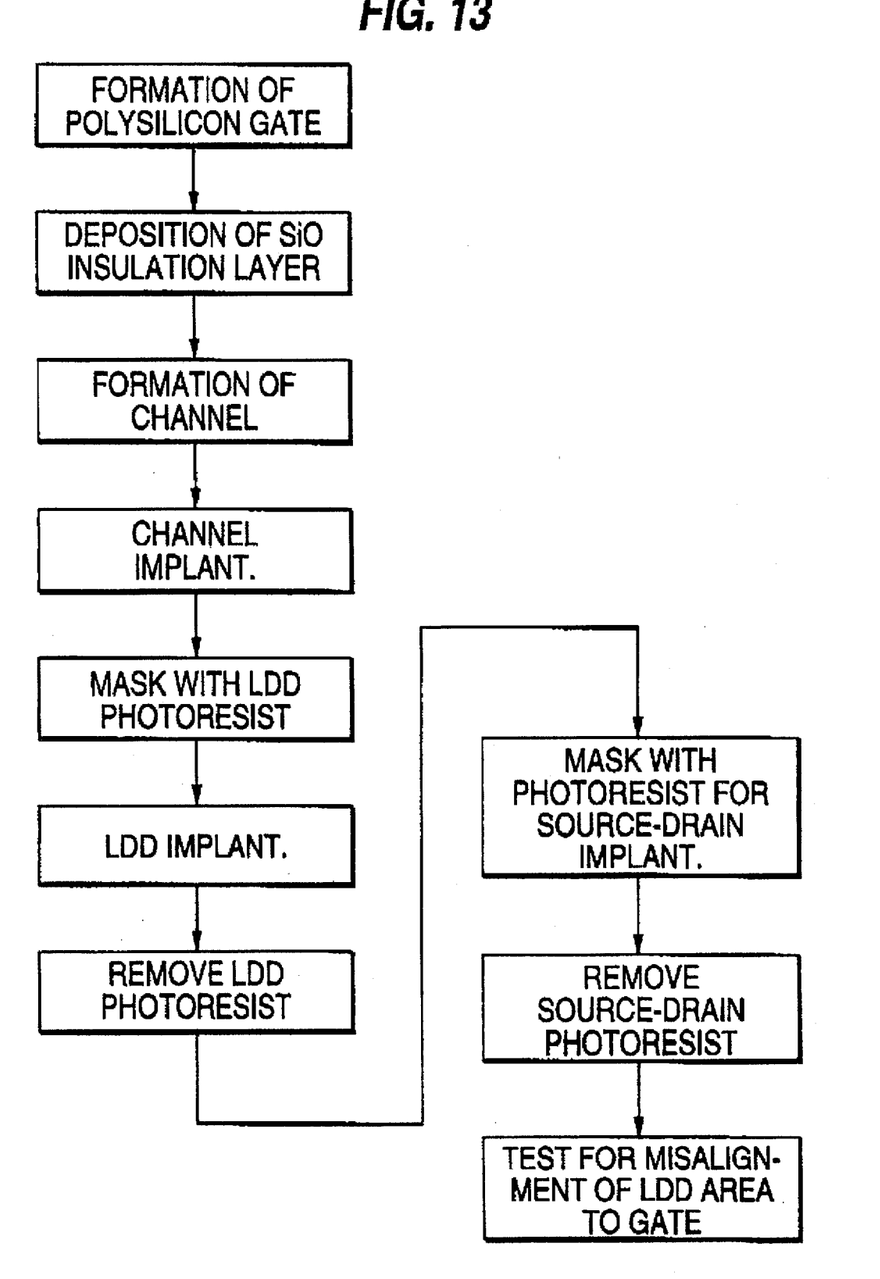
FIG. 13 is a flow chart of the steps shown in FIGS. 1 to 11.

FIG. 13 is a flow chart of the steps shown in FIGS. 1 to 11.

As illustrated in FIGS. 7 and 11, at various points in the construction of a TFT, specifically during LDD implantation and source-drain implantation, a mask 50, 51 is employed to protect various regions of the TFT assembly from implantation. Such masks are conventionally aligned visually to the polysilicon gate or to a line which is referenced to the polysilicon gate 30. However, after stripping off the LDD mask, one cannot determine the position of the LDD-implanted region, because this implantation does not result in any visibly printed structure.

Figure 14:
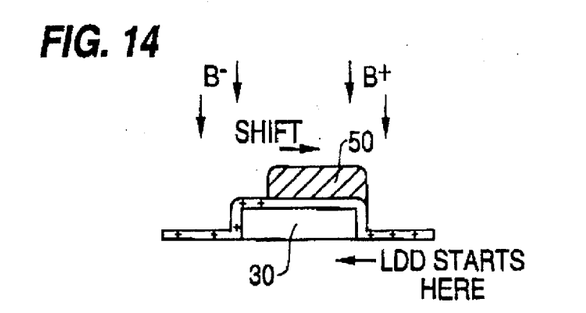
FIG. 14 illustrates an example of misalignment of the LDD implantation mask during LDD implantation in which the mask is shifted too far to the right.
Figure 15:
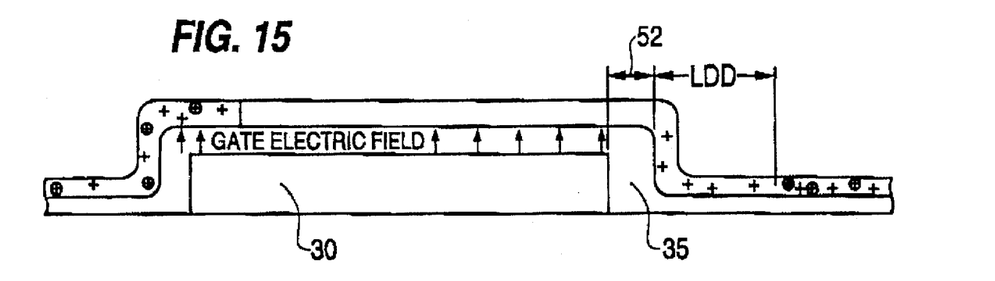
FIG. 15 is a cross-sectional view of the channel of the device resulting from the misalignment depicted in FIG. 14.

The alignment of the LDD implantation mask and the source-drain mask is critical in the proper functioning of a TFT. For example, FIG. 14 depicts a TFT assembly in which the mask 50 is slightly misaligned relative to the polysilicon gate 30 by shifting the mask 50 slightly to the right in relation to its proper position. After implantation, there is a slight gap 52 between the end of the oxide insulation layer which is underlaid by the polysilicon gate and the LDD-implanted channel layer. This gap 52 is represented in FIG. 15. This gap results in a section of a TFT channel, the conductivity of which cannot be controlled by the gate electric field and, thus, such a channel never conducts. Such a TFT cannot be turned on.

Figure 16:
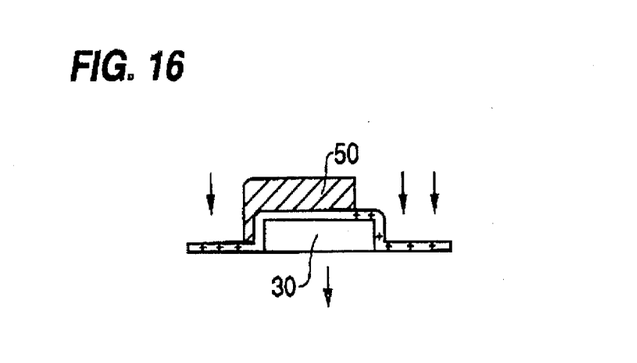
FIG. 16 illustrates an example of misalignment of the LDD implantation mask during LDD implantation in which the mask is shifted too far to the left.
Figure 17:
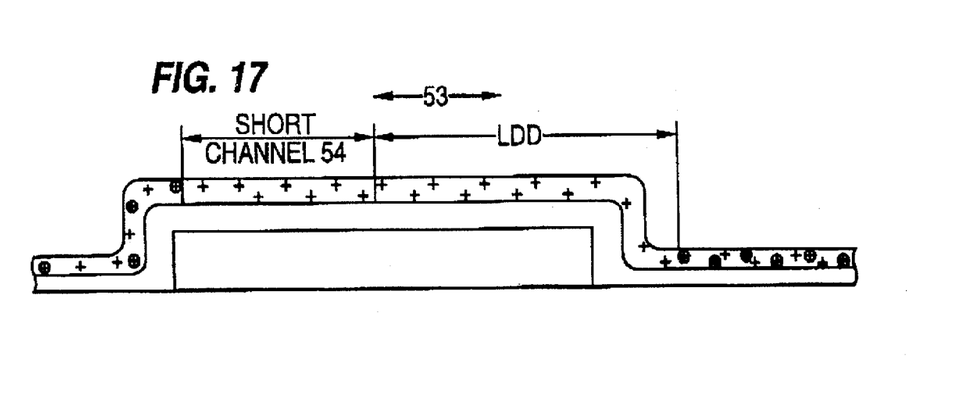
FIG. 17 depicts a cross-sectional view of the channel of the device resulting from the misalignment depicted in FIG. 16.

FIG. 16 depicts a TFT assembly in which the mask 50 is slightly misaligned relative to the polysilicon gate 30 by shifting the mask slightly to the left in relation to its proper position. After implantation, there is a large overlap 53 between the end of oxide insulation layer which is underlaid by the polysilicon gate 30 and the LDD-implanted channel layer. This overlap is represented in FIG. 17. Such overlap results in a section of a TFT which has a shortened channel 54. Such a channel possesses a high leak current and affects modulation of channel current by drain voltage, i.e., drain acts as an additional back bias.

As the drawings illustrate, the alignment of the LDD implantation mask and the source-drain mask relative to the polysilicon gate directly affects the performance of the TFT. The source-drain mask alignment, however, is not as critical as alignment of the LDD implantation mask. Misalignment of the LDD implantation mask can result in a non-functioning TFT. However, it has been difficult to correlate directly a number of failed or malfunctioning TFTs with misalignment of the LDD implantation mask as opposed to attributing the failure or malfunction to another flaw in the fabrication, such as a contaminant.

Figure 18:
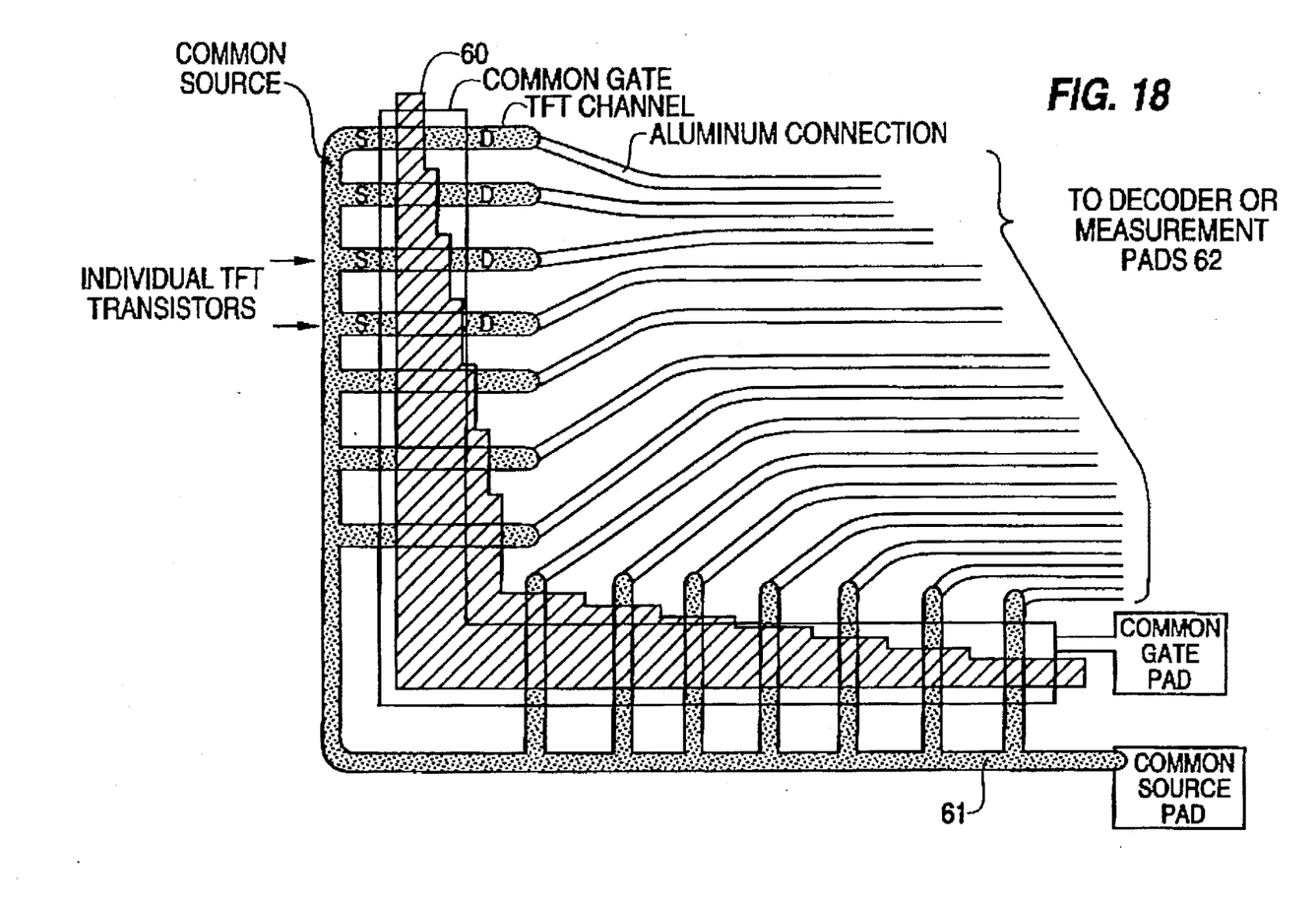
FIG. 18 illustrates the test device as it would operate in TFT fabrication.

One embodiment of the present invention is a method for determining whether misalignment of the LDD implantation mask is responsible for the failure or malfunctioning of a TFT. Such a determination can be made by means of the test apparatus of the present invention, as represented in FIG. 18. Such a test structure comprises a test implantation mask 60 for the construction of an implantation region for a multiple number of semiconductor devices, which implantation mask 60 has a sloped or stepped profile in which the masked area increases as the implantation mask 60 extends from one semiconductor device to an adjacent semiconductor device. If the test implantation mask 60 has a stepped profile, then the profile increases sequentially in discrete steps from one semiconductor device to an adjacent semiconductor device. The stepped profile comprises steps which differ from one another in increments of 2 µm preferably increments of 1 µm, more preferably increments of 0.5 µm, and still more preferably increments of 0.1 µm.

In one embodiment of the present invention, the implantation mask is a LDD implantation mask. This mask is employed such that a step of the test apparatus mask is selected so as to correspond to the proper alignment of the LDD implantation mask. This test structure is employed as the LDD implantation mask during the fabrication of a batch of TFTs. During the fabrication of the TFTs, the source regions of the multiple TFTs are linked by a common source pad 61, while each individual drain region is connected to a decoder or a measurement pad 61. After construction of the TFT is completed, each TFT can then be measured to determine in which TFT the LDD-implanted channel layer has been properly positioned because of correct alignment of the LDD implantation mask.

Moreover, by determining which TFTs corresponding to which step of the test apparatus are properly functioning, it can be determined whether the LDD implantation mask was properly aligned or, if not properly aligned, in which direction and by what distance the LDD implantation mask was misaligned.

Figure 19:
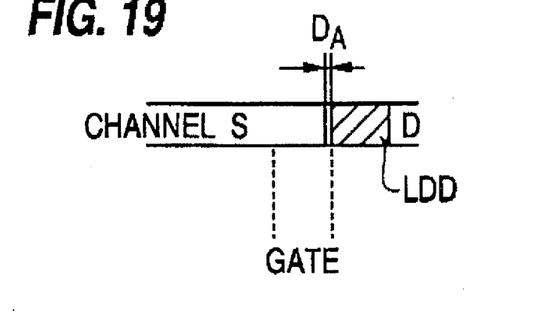
FIG. 19 is a top view illustrating the proper overlap between the end of oxide insulation layer underlaid by the polysilicon gate and the LDD-implanted channel layer.
Figure 20:
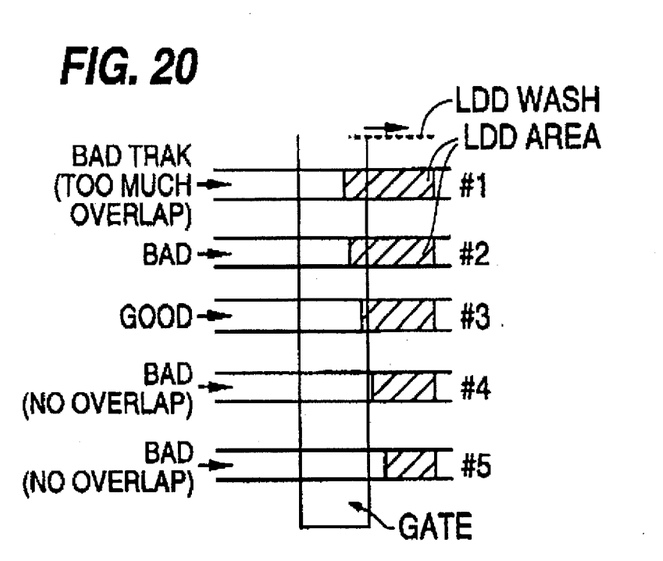
FIG. 20 depicts how the test apparatus of the present invention would determine proper alignment of the LDD implantation mask.

This method is illustrated in FIGS. 19 to 22. FIG. 19 depicts the proper overlap between the end of oxide insulation layer which is underlaid by the polysilicon gate and the LDD-implanted channel layer. In FIG. 20, the test structure is properly aligned such that the middle TFT (#3) has the proper overlap between the end of oxide insulation layer which is underlaid by the polysilicon gate and the LDD-implanted channel layer. This overlap is usually in the range of 0.1 to 1 µm. In the test structure illustrated in the drawings, the steps increase in increments of 1 µm. As one progresses away from the central TFT, the overlap either becomes too large resulting in a shortened channel (#1) or the overlap is diminished until there is no overlap (#4) or a gap forms, resulting in a TFT which cannot be turned on.

Figure 21:
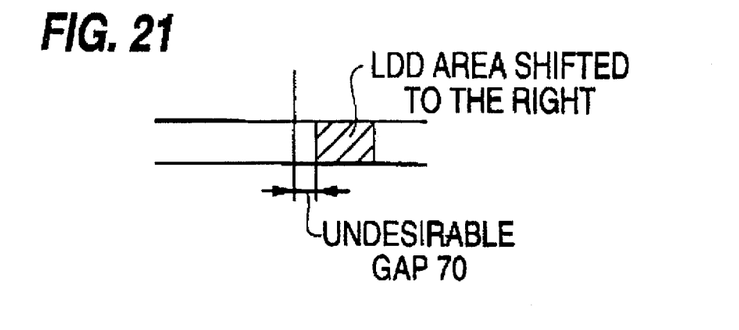
FIG. 21 is a top view illustrating an improper gap between the end of oxide insulation layer underlaid by the polysilicon gate and the LDD-implanted channel layer.
Figure 22:
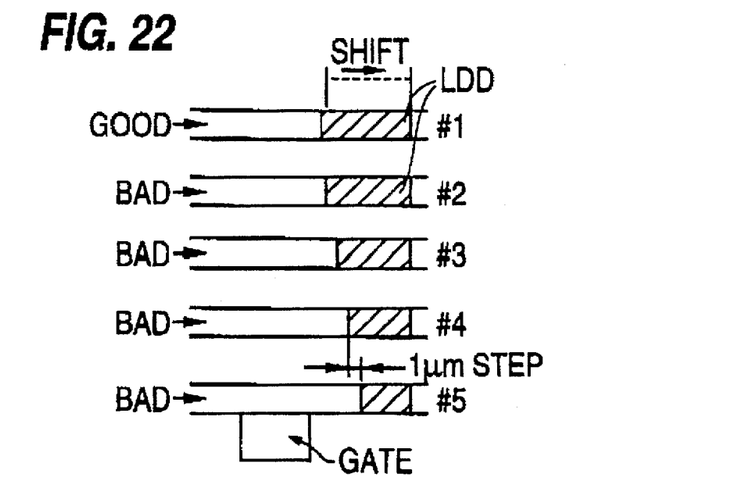
FIG. 22 depicts how the test apparatus of the present invention would determine misalignment of the LDD implantation mask.

FIG. 21 illustrates an improper gap 70 between the end of the oxide insulation layer which is underlaid by the polysilicon gate and the LDD-implanted channel layer. FIG. 22 represents the situation in which the LDD implantation mask has been shifted relative to the polysilicon gate in that the mask is shifted 2 µm to the right relative to FIG. 21. Now TFT (#3) does not have the proper overlap, but rather TFT (#1) has the proper overlap (the test structure step of which is 2 µm shorter than the value for TFT #3). In determining whether and by how much the LDD mask is misaligned, one measures which TFT is functioning properly, one determines how many steps of the test structure and in which direction the functioning TFT is from the step of the test apparatus mask selected so as to correspond to the proper alignment of the LDD implantation mask, and one multiplies the incremental increase per step by the number of steps the functioning TFT is from the step of the test apparatus mask selected so as to correspond to the proper alignment of the LDD implantation mask.

In another embodiment of the present invention, the test structure can be employed to determine the correct alignment of an LDD implantation. In this method, prior to the fabrication of a batch of TFTs, the proper alignment of the LDD implantation mask and the source-drain mask is determined. This determination can be achieved by employing the test apparatus of the present invention such that a step of the test apparatus mask is selected so as to correspond to the proper alignment of the implantation mask. This test structure is employed as the implantation mask during the fabrication of a batch of TFTs. After TFT construction is completed, each TFT can then be measured to determine in which TFT the implantation mask has been properly positioned.

Moreover, by determining which TFTs, corresponding to which step of the test apparatus, are properly functioning, it can be determined whether the implantation mask was properly aligned or, if not properly aligned, in which direction and by what distance the implantation mask was misaligned.

Obviously, numerous modifications and variations of the present invention are possible in light of the above teachings. It is therefore to be understood that within the scope of the appended claims, the invention may be practiced otherwise than as specifically described herein.

What is claimed is:

1. A method for determining alignment of an implantation mask employed in the construction of thin film transistors (TFTs), comprising:

forming a plurality of adjacent TFTs on a semiconductor substrate, said forming comprising employing a test implantation mask, wherein said test implantation mask has a profile in which a masked area of each TFT being formed increases as the test implantation mask extends from one TFT to an adjacent TFT;

selecting a portion of the test implantation mask corresponding to one of said TFTs;

testing said TFT corresponding to said selected portion of the test implantation mask; and determining alignment of said test implantation mask based on said testing.

2. The method according to claim 1, wherein said test implantation mask is an light doped drain (LDD) implantation mask.

3. The method according to claim 2, in which said profile is sloped.

4. The method according to claim 2, in which said profile is stepped.

5. The method according to claim 4, wherein said stepped profile comprises steps which differ from one another in increments of 2 µm.

6. The method according to claim 4, wherein said stepped profile comprises steps which differ from one another in increments of 1 µm.

7. The method according to claim 4, wherein said stepped profile comprises steps which differ from one another in increments of 0.5 µm.

8. The method according to claim 4, wherein said stepped profile comprises steps which differ from one another in increments of 0.1 µm.

9. The method according to claim 1, further comprising:
testing each of said plurality of adjacent TFTs; and
determining a direction in which said test implantation mask is misaligned based on said testing.

10. The method according to claim 1, further comprising:
testing each of said plurality of adjacent TFTs; and
determining an amount by which said test implantation mask is misaligned based on said testing.

11. A method for determining alignment of an implantation mask employed in the construction of thin film transistors (TFTs), comprising:

forming a plurality of adjacent gate electrodes on a semiconductor substrate;

covering said gate electrodes with an insulating layer;

forming a channel layer associated with each of said gate electrodes;

forming a mask over said semiconductor substrate wherein said mask has a profile such that a masked area of each channel layer increases as said mask extends from one channel layer to an adjacent channel layer;

with said mask, forming a light doped drain associated with each of said gate electrodes;

forming a source and drain associated with each of said gate electrodes so as to form a plurality of transistors; and testing at least one of said transistors to determine the alignment of said mask.

12. The method according to claim 11, wherein said implantation mask is an light doped drain (LDD) implantation mask.

13. The method according to claim 11, in which said profile is sloped.

14. The method according to claim 11, in which said profile is stepped.

15. The method according to claim 14, wherein said stepped profile comprises steps which differ from one another in increments of 2 µm.

16. The method according to claim 14, wherein said stepped profile comprises steps which differ from one another in increments of 1 µm.

17. The method according to claim 14, wherein said stepped profile comprises steps which differ from one another in increments of 0.5 µm.

18. The method according to claim 14, wherein said stepped profile comprises steps which differ from one another in increments of 0.1 µm.

* * * * *